(12) United States Patent
Lee et al.

(10) Patent No.: US 7,566,912 B2
(45) Date of Patent: Jul. 28, 2009

(54) LIGHT EMITTING DIODE PACKAGE

(75) Inventors: Young Ki Lee, Seoul (KR); Seon Goo Lee, Gyunggi-Do (KR); Seog Moon Choi, Seoul (KR); Sang Hyun Shin, Gyunggi-Do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 86 days.

(21) Appl. No.: 11/717,154

(22) Filed: Mar. 13, 2007

(65) Prior Publication Data

US 2007/0221928 A1    Sep. 27, 2007

(30) Foreign Application Priority Data

Mar. 14, 2006    (KR) .................. 10-2006-0023519

(51) Int. Cl.
    *H01L 33/00*    (2006.01)
(52) U.S. Cl. .............................. 257/98; 257/95; 257/99; 257/E33.072
(58) Field of Classification Search .................. 257/95, 257/98, 99, E33.072
    See application file for complete search history.

(56) References Cited

U.S. PATENT DOCUMENTS 7,268,014 B2 * 9/2007 Lee et al. ..................... 438/106
2007/0080360 A1 * 4/2007 Mirsky et al. ................. 257/99

FOREIGN PATENT DOCUMENTS

JP    2005-210057 A    8/2005
WO   WO 02/089219 A1   11/2002

\* cited by examiner

*Primary Examiner*—Victor A Mandala
(74) *Attorney, Agent, or Firm*—McDermott Will & Emery LLP (57) ABSTRACT

A light emitting diode package which is superior in heat radiation and easily manufacturable. In the light emitting diode package, an Al substrate has a reflective cup formed thereon. At least one light emitting diode chip is disposed on a bottom surface of the reflective cup. An Al anodized film extends through the Al substrate to divide the bottom surface of the reflective cup into a plurality of substrate electrodes. Here, at least one of the substrate electrodes is surrounded by the Al anodized film. Also, the substrate electrodes are connected to a light emitting diode chip, respectively.

17 Claims, 7 Drawing Sheets

PRIOR ART

LIGHT EMITTING DIODE PACKAGE

CLAIM OF PRIORITY

This application claims the benefit of Korean Patent Application No. 2006-23519 filed on Mar. 14, 2006 in the Korean Intellectual Property Office, the disclosure of which is incorporated herein by reference.

BACKGROUND OF THE INVENTION

1. Field of the Invention

The present invention relates to a light emitting diode package, more particularly, which is superior in heat radiation properties and easily manufacturable.

2. Description of the Related Art

In general, a light emitting diode (LED) is spotlighted in various fields as an environment-friendly light source which does not trigger pollution. Recently, the LED has found its application broadened to various fields such as indoor and outdoor lightening, car headlights, backlight units (BLU) of display devices. Thus, the LED is required to possess high efficiency and superior heat radiation properties. The high efficiency LED can be obtained primarily by improving materials and structure thereof. Besides, structure and materials of an LED package need to be elevated in quality.

Such an LED generates high-temperature heat. Thus, the LED package should effectively radiate the high-temperature heat generated from the LED. Otherwise, the LED is increased in temperature and thus degraded in properties thereof. This accordingly shortens useful life of the LED. Therefore, there have been ongoing efforts to effectively radiate heat generated from the LED. To enhance radiation properties of the LED package, PCT No. WO2002/089219 discloses a technology for utilizing, as an LED package substrate, a metal substrate which has an electrode pin penetrating a through hole and surrounded by an insulator to be separated from the through hole. Also, Japanese Laid Open Patent Application No. 2005-210057 teaches a technology for integrating an insulating resin with a plurality of separate metal members to utilize as an LED package substrate.

Figure 1:
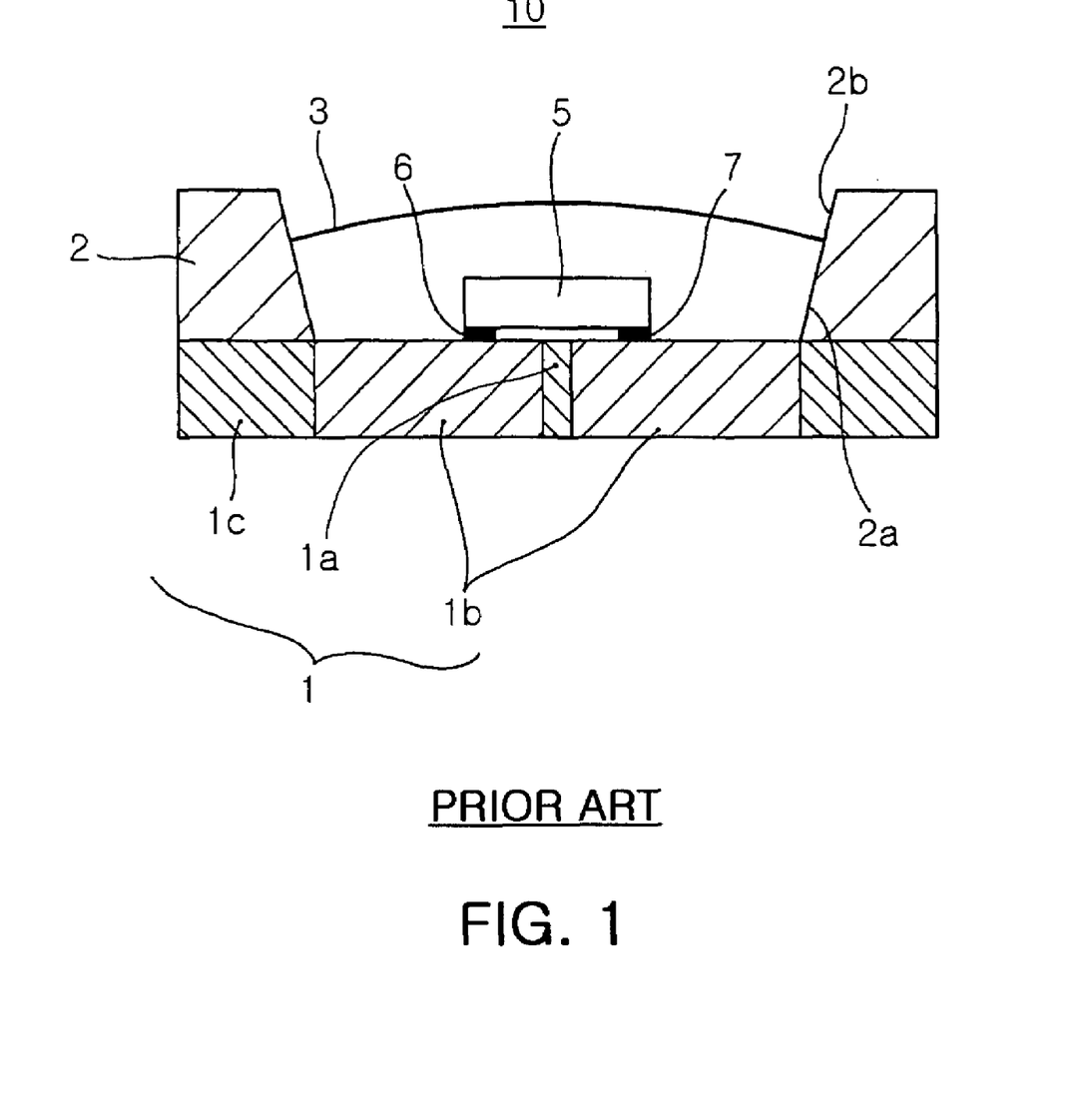
FIG. 1 is a cross-sectional view illustrating a conventional light emitting diode package.

FIG. 1 is a schematic cross-sectional view illustrating a conventional light emitting diode package. Referring to FIG. 1, the conventional light emitting diode package 10 includes a plurality of metal members 1b, a resin 1a formed between the metal members 1b, and a resin 1c for fixing the metal members 1b, which are all integrated together into a substrate 1. An LED device 5 is mounted on the substrate 1. The LED device 5 is electrically connected to the metal members 1b through conductive bonding materials 6 and 7. Reflective members 2 each having a reflecting surface 2b are formed on the substrate 1. The light emitting diode package 10 has a transparent member 3 formed thereon to emit light from the LED device 5 upward. Alternatively, the light emitting diode package 10 may contain phosphors therein to convert a wavelength of light from the light emitting diode 5.

The LED device 5 radiates light and heat at the same time. Here, the heat is radiated outside through the metal members 1b of the substrate 1. To radiate heat, the metal members 1b should be thermally conductive and properly sized. However, the metal members 1b of the substrate 1 are fixed through resins 1a and 1c, and thus heat is radiated through a smaller area which excludes portions of the resins 1a and 1c. Furthermore, the metal members 1b are integrated into the substrate 1 through resins 1a and 1c and the reflective members 2 should be formed on the substrate 1. This renders the light emitting diode package difficult to manufacture.

SUMMARY OF THE INVENTION

The present invention has been made to solve the foregoing problems of the prior art and therefore an aspect of the present invention is to provide a light emitting diode package which is excellent in heat radiation and easily manufacturable.

According to an aspect of the invention, the light emitting diode package includes an Al substrate having a reflective cup formed thereon; at least one light emitting diode chip disposed on a bottom surface of the reflective cup; and an Al anodized film extending through the Al substrate to divide the bottom surface of the reflective cup into a plurality of substrate electrodes, wherein at least one of the substrate electrodes is surrounded by the Al anodized film, and wherein the substrate electrodes are connected to a light emitting diode chip, respectively.

The light emitting diode package further includes a plurality of rear electrodes formed underneath the Al substrate to be electrically connected to the substrate electrodes, respectively.

The Al anodized film is extended to edges of the Al substrate.

The light emitting diode package further includes at least one zener diode disposed on the bottom surface of the reflective cup.

The light emitting diode package further includes a lens formed on the reflective cup. Also, the light emitting diode package further includes a fixing part formed on a top portion of the reflective cup to fix the lens.

According to an embodiment of the invention, the light emitting diode chip comprises one light emitting diode chip. The bottom surface of the reflective cup is divided into first and second substrate electrodes by the Al anodized film extending through the Al substrate, wherein at least one of the first and second substrate electrodes is surrounded by the Al anodized film, and wherein the first and second substrate electrodes are electrically connected to the light emitting diode chip, respectively.

The light emitting diode package further includes a zener diode disposed on the bottom surface of the reflective cup, wherein the light emitting diode chip is disposed on the first substrate electrode, and wherein the zener diode is disposed on the second substrate electrode.

According to another embodiment of the invention, the light emitting diode chip includes a plurality of light emitting diode chips. The three light emitting diode chips include green, blue and red light emitting chips.

The bottom surface of the reflective cup is divided into first to sixth substrate electrodes by the Al anodized film extending through the Al substrate, wherein at least five of the first to sixth substrate electrodes are surrounded by the Al anodized film, and wherein the first to sixth substrate electrodes are electrically connected to the light emitting diode chips, respectively.

The light emitting diode package further includes first to sixth rear electrodes formed underneath the Al substrate to be electrically connected to the first to sixth substrate electrodes, respectively.

The light emitting diode package further includes two zener diodes disposed on the bottom surface of the reflective cup, wherein the three light emitting diode chips are disposed on the first, second and third substrate electrodes, respectively, and wherein the two zener diodes are disposed on two of the fourth, fifth and sixth substrate electrodes, respectively. Alternatively, the light emitting diode package further includes three zener diodes disposed on the bottom surface of the reflective cup, wherein the three light emitting diode chips are disposed on the first, second and third substrate electrodes, respectively, and wherein the three zener diodes are disposed on the fourth, fifth and sixth substrate electrodes, respectively.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
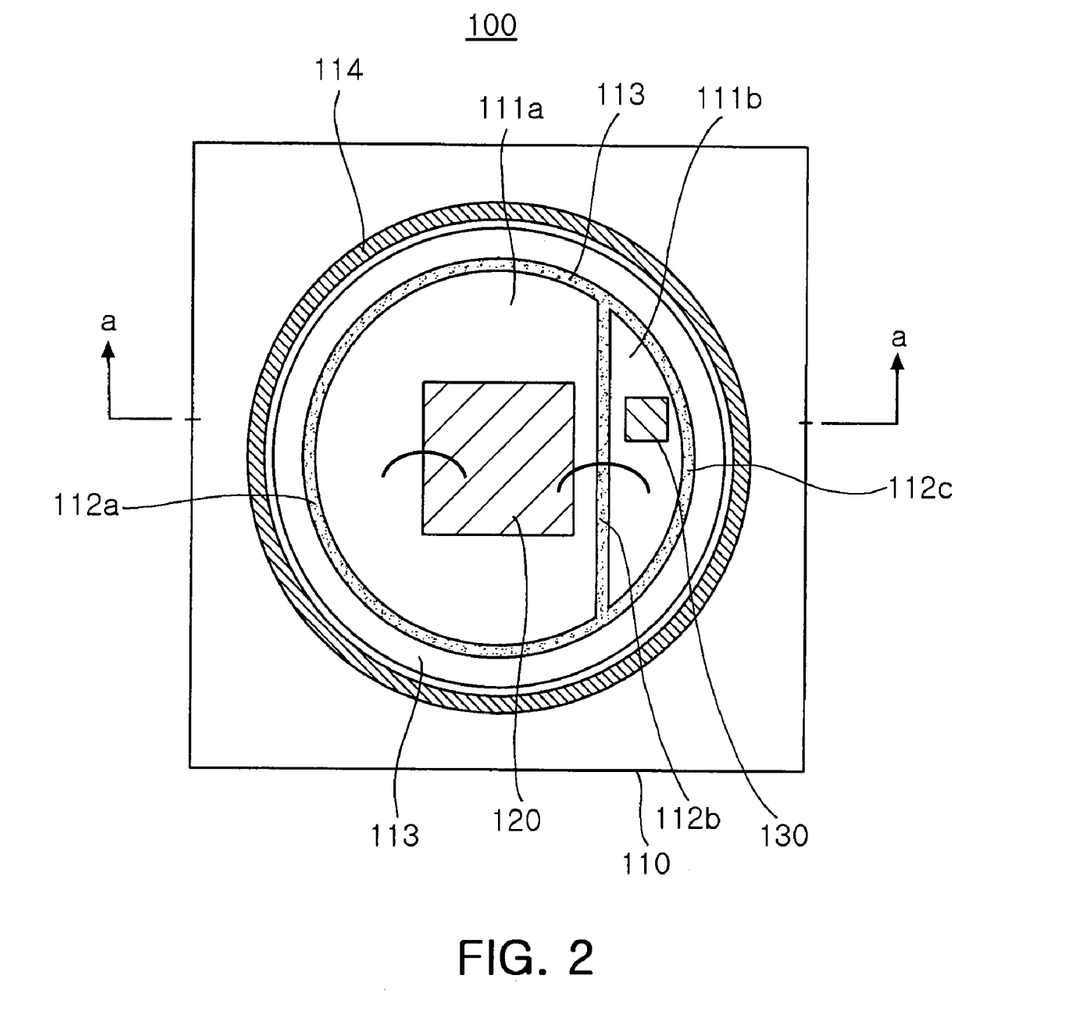
FIG. 2 is a plan view illustrating a light emitting diode package according to an embodiment of the invention.
Figure 3:
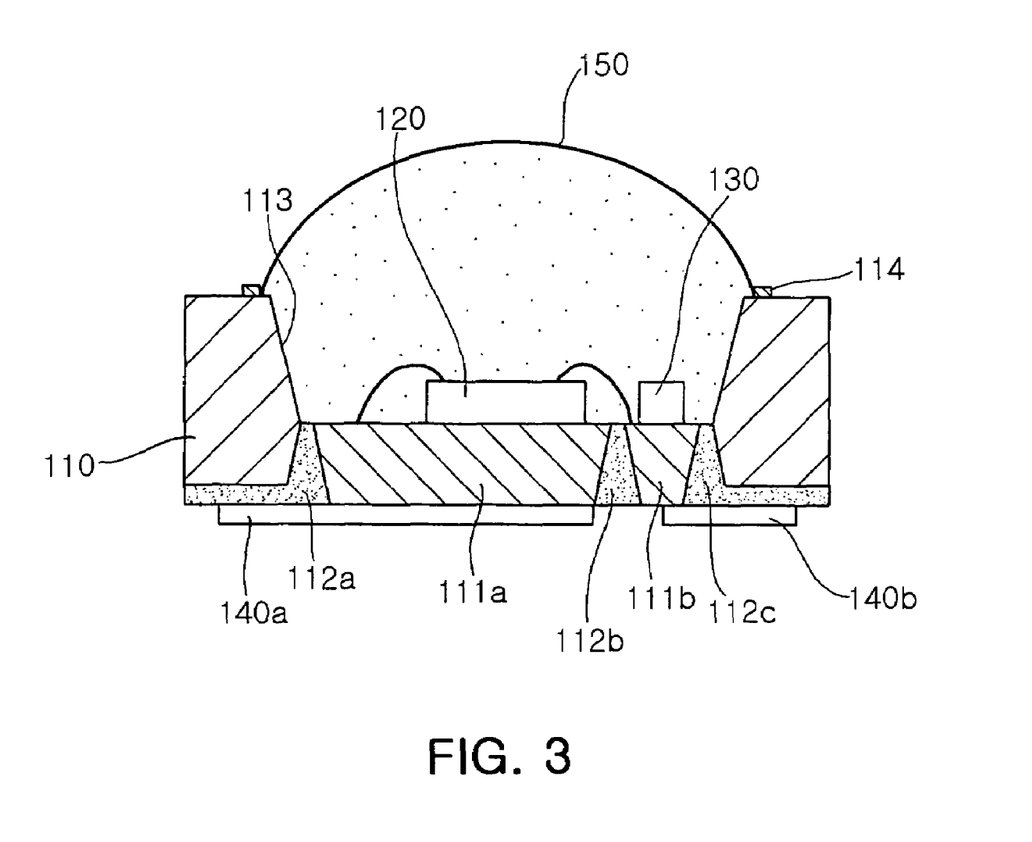
FIG. 3 is a cross-sectional view cut along the line a-a' of FIG. 2.

FIG. 2 is a plan view illustrating a light emitting diode package according to an embodiment of the invention. FIG. 3 is a cross-sectional view cut along the line a-a' of FIG. 2.

Referring to FIGS. 2 and 3, the light emitting diode package 100 of the invention includes an Al substrate 110 with a reflective cup 113 formed thereon. The Al substrate 110 is divided into a first substrate electrode 111a and a second substrate electrode 11b by an Al anodized film 112; 112a 112b, 112c. Also, first and second substrate electrodes 111a and 111b are surrounded by the Al anodized film 112. That is, the Al substrate 110 is divided into a plurality of substrate electrodes 11a and 111b by the Al anodized film 112 extending through the substrate 110.

A light emitting diode chip 120 is disposed on the first substrate electrode 111a. Optionally, a zener diode 130 may be disposed on the second substrate electrode 111b to protect the light emitting diode chip 120 from static electricity potentially arising from around the light emitting diode package or a sudden change in a voltage applied to the light emitting diode chip 120. The light emitting diode chip 120 is electrically connected to the first and second substrate electrodes 11a and 111b through a wire, respectively. Alternatively, the light emitting diode chip 120 may be chip-bonded to the first and second substrate electrode 111a and 111b to be electrically connected, respectively.

The reflective cup 113 formed on the Al substrate 110 can be formed by etching a desired portion of the Al substrate 110. As shown, the reflective cup 113 is integrated into the Al substrate 110. This obviates a need for boding a separate reflective plate onto the substrate, thus facilitating a manufacturing process of the light emitting diode package.

The anodized film 112 extending through the Al substrate 110 is formed, by selective anodization, in a preset area of the Al substrate 10 where the Al substrate 10 is supposed to be divided. To form the Al anodized film 112, the Al substrate 110 may be directly anodized through a zig. Alternatively, it is possible to mask the Al substrate 10 with a desired pattern to anodize partially exposed portions of the Al substrate 10. After anodizing is performed, electro polishing can be employed to adjust luminance of anodized and non-anodized surface portions of the Al substrate.

Meanwhile, the Al substrate 110 serves as a submount for mounting the light emitting diode chip 120 or a heat sink for radiating heat generated from the light emitting diode chip 120. Also, the Al anodized film 112 serves as an insulator for dividing the bottom surface of the reflective cup 113 into the first and second substrate electrodes 111a and 111b. Moreover, the Al anodized film 112 functions to radiate heat from the light emitting diode chip 120 outward. The Al anodized film 112 radiates heat effectively due to a high heat transfer coefficient of about 25 W/mK.

As described above, the light emitting diode package 100 of the invention utilizes a substrate mainly composed of Al, thus superior in heat radiation. Further, the Al anodized film for use in dividing the substrate exhibits relatively high heat transfer properties, thus radiating heat superbly. Also, the reflective cup, the substrate and the electrodes are formed integral, thereby precluding a need for bonding or assembling the substrate and the reflective cup together as in the prior art. This reduces manufacturing costs of the light emitting diode and facilitates a manufacturing process thereof.

Referring to FIG. 3, first and second rear electrodes 140a and 140b are formed underneath the Al substrate 110 to be electrically connected to the first and second substrate electrodes 111a and 111b, respectively. The substrate electrodes 111a and 111b are applied with a power voltage from outside through the rear electrodes 140a and 140b, thereby supplying a driving a voltage to the light emitting diode chip 120 or a device (zener diode) which may be disposed on the bottom surface of the reflective cup.

As described above, the Al substrate 110 is divided into the first substrate electrode 111a and the second substrate electrode 111b by the Al anodized film 112. Notably, the first and second substrate electrodes 111a and 111b are surrounded by the Al anodized film 112. However, optionally, either one of the first substrate electrode 111a and the second substrate electrode 111b may be surrounded by the Al anodized film 112 extending through the substrate to divide the substrate 110 into a plurality of electrodes. For example, only the first substrate electrode 111a can be surrounded by the Al anodized film 112.

The first substrate electrode 111a is electrically connected to the first rear electrode 140a. Likewise, the second substrate electrode 111b is electrically connected to the second rear electrode 140b. The first and second rear electrodes 140a and 140b can be electrically connected to electrodes (not illustrated) of a submount (e.g., PCB) where the light emitting diode package 100 is mounted. These rear electrodes 140a and 140b are formed by one selected from a group consisting of sputtering, electrolytic plating, electroless plating and screen printing.

The Al anodized film 112a and 112c is extended to edges of the Al substrate 110. This prevents an underside surface of the reflective cup 113 from being electrically connected to the first and second substrate electrodes 111a and 111b through the rear electrodes 140a and 140b.

A lens 150 may be disposed on the reflective cup 113. This lens 150 collects light from the light emitting diode chip 120, or contains phosphors therein to convert a wavelength of light emitted from the light emitting diode chip. The lens 150 is made of a resin such as silicone and epoxy, and plastic and glass. The lens 150 can be fixed to a lens fixing part 114 formed on a top portion of the reflective cup.

Figure 4:
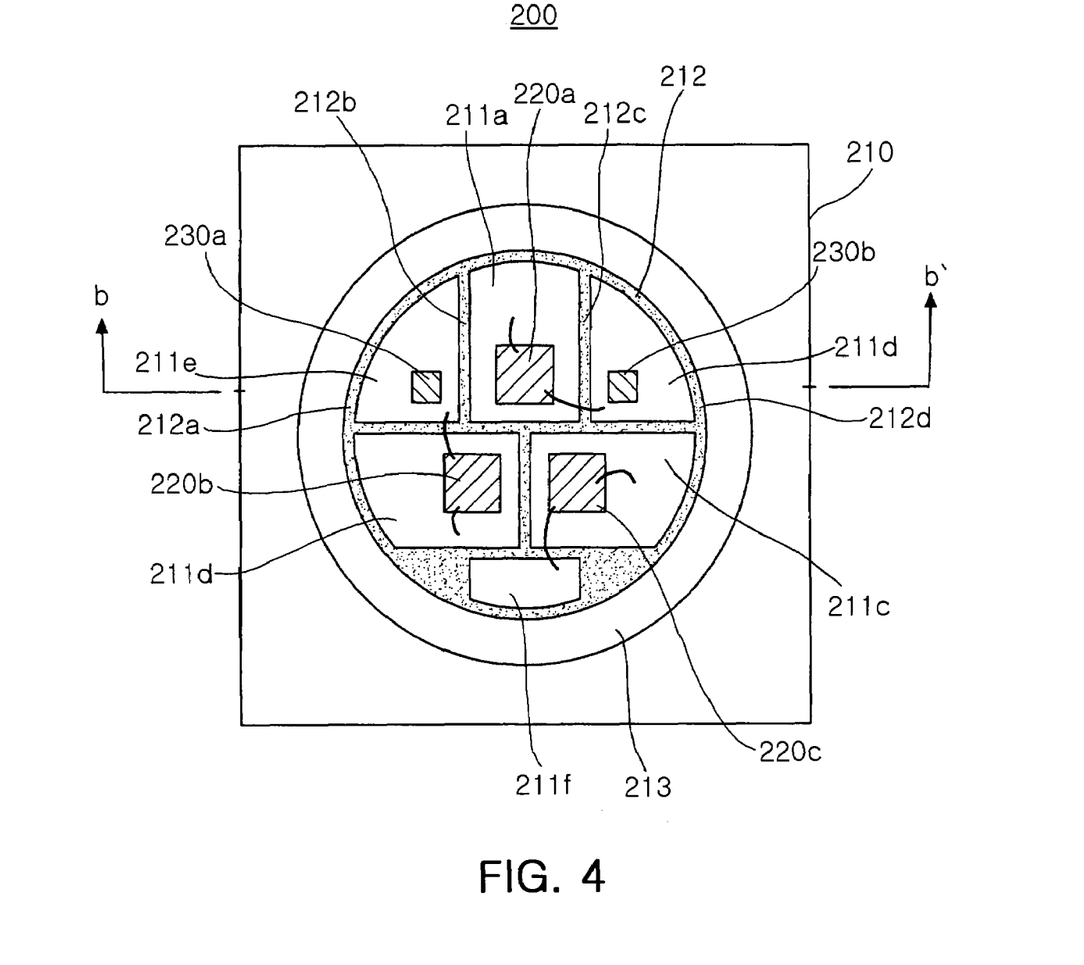
FIG. 4 is a plan view illustrating a light emitting diode package according to another embodiment of the invention.
Figure 5:
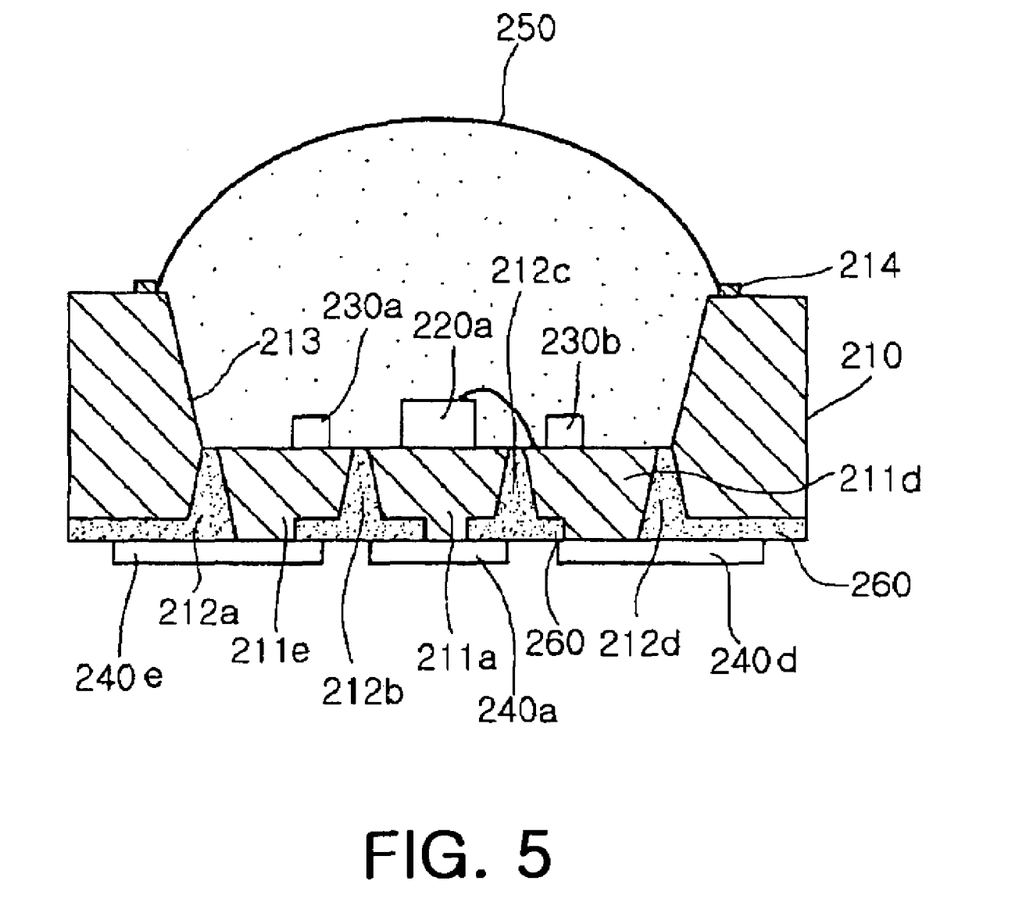
FIG. 5 is a cross-sectional view cut along the line b-b' of FIG. 4.
Figure 6:
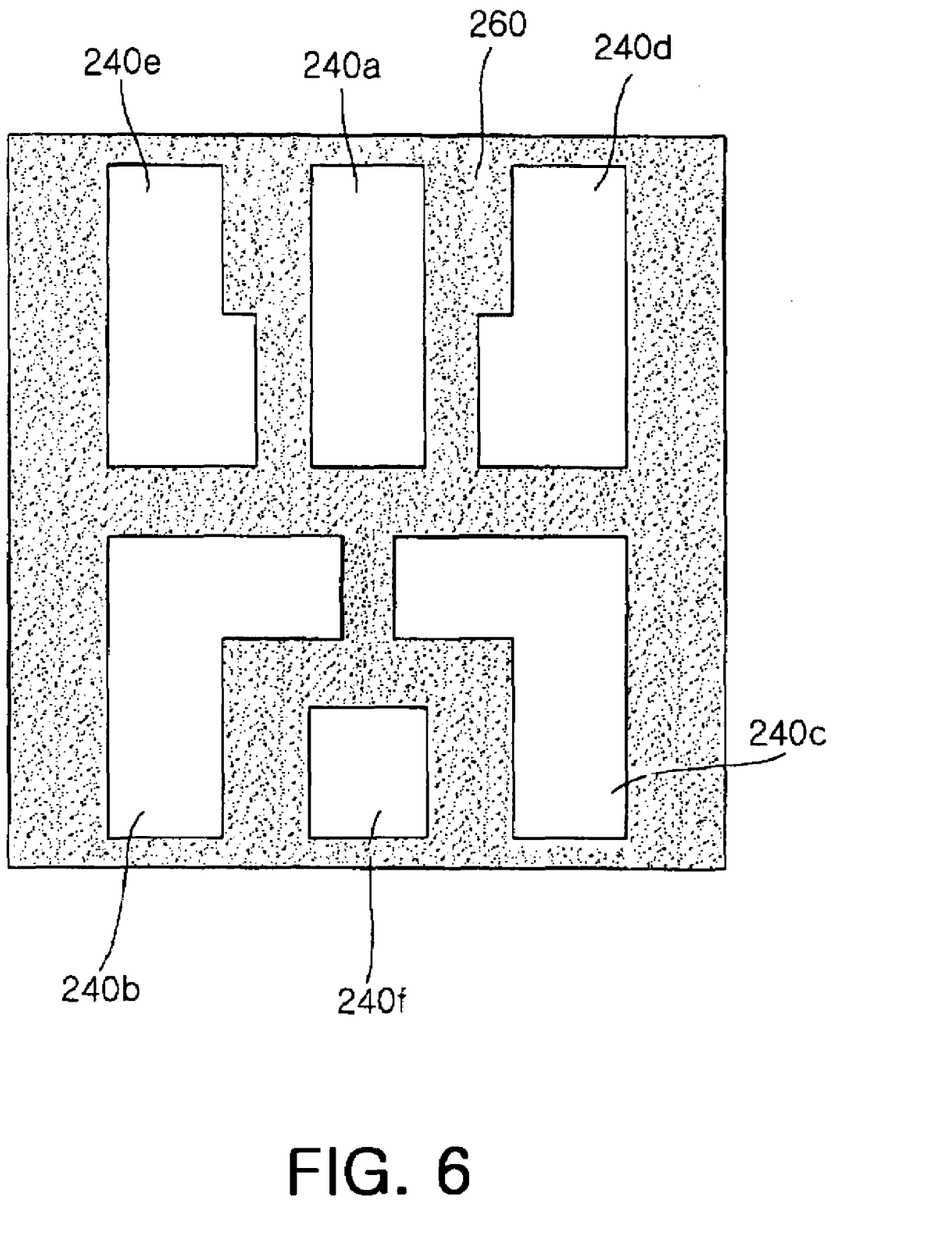
FIG. 6 is a rear elevation view illustrating a light emitting diode package.

FIG. 4 is a plan view illustrating a light emitting diode package according to another embodiment of the invention. FIG. 5 is a cross-sectional view cut along the line b-b' of FIG. 4. FIG. 6 is a rear elevation view of FIG. 4.

Referring to FIGS. 4 and 5, a light emitting diode package 200 of the invention includes an Al substrate 210 having a reflective cup 213 formed thereon. The reflective cup 113 has a bottom surface divided into a plurality of substrate electrodes 211a, 211b, 211c, 211d, 211e, and 211f by an Al anodized film 212 extending through a substrate 150. Referring to FIG. 5, the Al anodized film 212 is divided into four parts 212a, 212b, 212c, and 212d for convenience's sake. At least five of the substrate electrodes are surrounded by the Al anodized film 212. For example, the bottom surface of the reflective cup 113 is divided into first to sixth substrate electrodes 211a to 211f by the Al anodized film 212. The first to sixth substrate electrodes 211a to 211f may be surrounded by the Al anodized film 212, respectively.

A plurality of light emitting diode chips are mounted on the first to sixth substrate electrodes 211a to 211f. For example, three green, blue and red light emitting diode chips are mounted on the first substrate electrode 211a, the second substrate electrode 211b and the third substrate electrode 211c, respectively.

The three light emitting diode chips 220a, 220b and 220c may be electrically connected to the substrate electrodes through wires. For example, the green light emitting diode chip 220a is electrically connected to the first to fourth substrate electrodes 211a and 211d, respectively. The blue light emitting diode chip 220b is electrically connected to the second to fifth substrate electrodes 211b and 211e. The red light emitting diode chip 220c is connected to the third to sixth electrodes 211c and 211f, respectively.

Optionally, at least two zener diodes 230a and 230b may be disposed on the bottom surface of the reflective cup 213 to protect the chips. The zener diodes 230a and 230b serve to protect the light emitting diode chips from static electricity or sudden voltage change. For example, one 230a of the zener diodes may be disposed on the fourth substrate electrode 211d to protect the green light emitting diode chip 220a from static electricity. Also, the other zener diode 230b may be disposed on the fifth substrate electrode 211e to protect the blue light emitting diode chip 220b from static electricity.

The green and blue light emitting diode chips 220a and 220b are made of gallium nitride (GaN) and thus vulnerable to static electricity and sudden change in a voltage applied. Accordingly, the light emitting diode chips 220a and 220b are primarily protected by the zener diodes 230a and 230b.

The red light emitting diode chip 220c is mainly made of gallium arsenide (GaAs) or gallium phosphor (GaP), thus possibly strong against surrounding static electricity or sudden change in the voltage applied. However, a zener diode (not illustrated) may be disposed on the sixth substrate electrode 211f to protect the chips from static electricity.

The light emitting diode package 200 of the invention may include green, blue and red light emitting diode chips 220a to 200c, to be applicable as a white light source. Moreover, a plurality of light emitting diode chips emitting light of the same wavelength can be disposed to produce a high-brightness light emitting diode package.

Referring to FIGS. 4 to 6, the first to sixth substrate electrodes 211a to 211f are electrically connected to a plurality of rear electrodes 240a, 240b, 240c, 240d, 240e, and 240f, respectively. For example, the first to sixth rear electrodes 240a to 240f are formed underneath the Al substrate 210 to be electrically connected to the first to sixth substrate electrodes 211a to 211f, respectively. The substrate electrodes 211a to 211f supply a driving voltage to the light emitting diode chips or other device (e.g., zener diode) disposed on the bottom surface of the reflective cup. As shown in FIGS. 5 and 6, an anodized pattern 260 is formed underneath the Al substrate 210 to prevent different rear electrodes from having improper electrical connections.

According to the embodiments (refer to FIGS. 3 to 6), inside surfaces (reflecting surfaces) of the reflective cup 113 and 213 are made of Al. Therefore, the reflective cup 113 and 213 exhibits high reflectivity, further increasing light emitting efficiency of the light emitting diode package.

Figure 7:
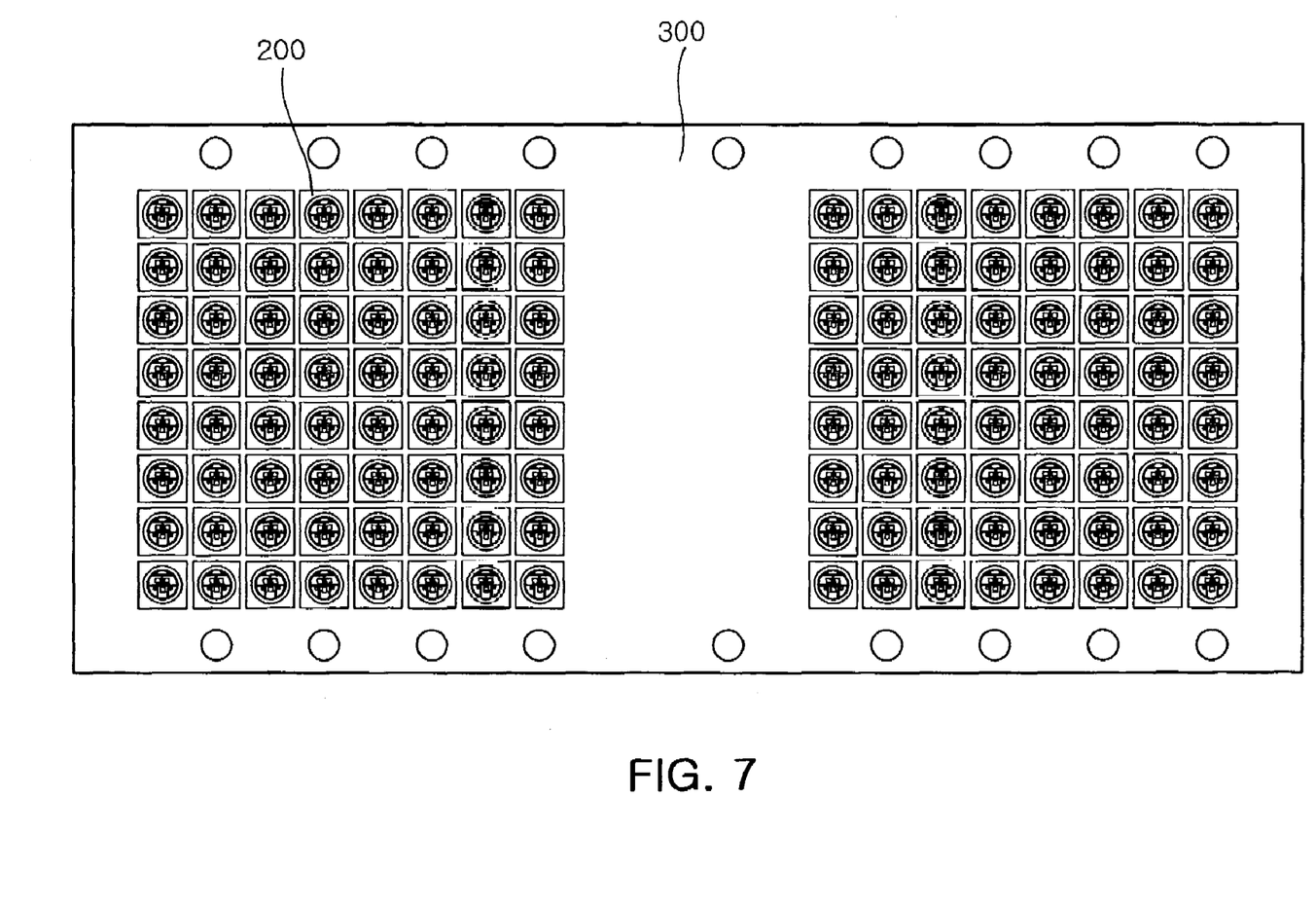
FIG. 7 is a plan view illustrating an array of a plurality of light emitting diode packages as shown in FIG. 4.

FIG. 7 is a plan view illustrating an array of a plurality of light emitting diode packages according to the invention. Referring to FIG. 7, the light emitting diode packages 200 are arrayed in lines and rows on an Al wafer 300, and separated into individual units by a diamond wheel, a cutting mold or a laser. Alternatively, a boundary between the packages is anodized to be transformed into alumina ($Al_2O_3$). Then, the boundary is diced or etched to be separated into an individual unit of package.

As set forth above, according to exemplary embodiments of the invention, an Al substrate is utilized as a means to radiate heat, thereby significantly enhancing heat radiation properties of a light emitting diode package. Also, a reflective cup, a substrate and an electrode are formed integral, thereby precluding a need for bonding or assembling the substrate and the reflective cup together. This accordingly reduces manufacturing costs of the light emitting diode package and facilitates a manufacturing process. In addition, the reflective cup has a reflective surface made of Al with high reflectivity. This as a result improves overall light emitting efficiency.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode package comprising:
   an Al substrate having a reflective cup formed thereon;
   at least one light emitting diode chip disposed on a bottom surface of the reflective cup;
   an Al anodized film extending, through the Al substrate to divide the bottom surface of the reflective cup into a plurality of substrate electrodes, and
   at least one zener diode disposed on the bottom surface of the reflective cup
   wherein at least one of the substrate electrodes is surrounded by the Al anodized film, and
   wherein the substrate electrodes are connected to a light emitting diode chip, respectively.

2. The light emitting diode package according to claim 1, further comprising a plurality of rear electrodes formed underneath the Al substrate to be electrically connected to the substrate electrodes, respectively.

3. The light emitting diode package according to claim 1, wherein the Al anodized film is extended to edges of the Al substrate.

4. The light emitting diode package according to claim 1, further comprising a lens formed on the reflective cup.

5. The light emitting diode package according to claim 4, further comprising a fixing part formed on a top portion of the reflective cup to fix the lens.

6. The light emitting diode package according to claim 1, wherein the light emitting diode chip comprises one light emitting diode chip.

7. The light emitting diode package according to claim 6, wherein, the plurality of substrate electrodes include first and second substrate electrodes which are formed by dividing the bottom surface of the reflective cup by the Al anodized film extending through the Al substrate, wherein at least one of the first and second substrate electrodes is surrounded by the Al anodized film, and wherein the first and second substrate electrodes are electrically connected to the light emitting diode chip, respectively.

8. The light emitting diode package according to claim 7, wherein the first and second substrate electrodes are surrounded by the Al anodized film, respectively.

9. The light emitting diode package according to claim 7, further comprising first and second rear electrodes formed underneath the Al substrate to be electrically connected to the first and second substrate electrodes, respectively.

10. The light emitting diode package according to claim 1, wherein the light emitting diode chip comprises a. plurality of light emitting diode chips.

11. The light emitting diode package according to claim 10, wherein the light emitting diode chips comprise three light emitting diode chips.

12. The light emitting diode package according to claim 11, wherein the three light emitting diode chips comprise green, blue and red light emitting chips.

13. The light emitting diode package according to claim 11, wherein the bottom surface of the reflective cup is divided into first to sixth substrate electrodes by the Al anodized film extending through the Al substrate,
    wherein at least five of the first to sixth substrate electrodes are surrounded by the Al anodized film, and
    wherein the first to sixth substrate electrodes are electrically connected to the light emitting diode chips, respectively.

14. The light emitting diode package according to claim 13, further comprising first to sixth rear electrodes formed underneath the Al substrate to be electrically connected to the first to sixth substrate electrodes, respectively.

15. The light emitting diode package according to claim 13, further comprising two zener diodes disposed on the bottom surface of the reflective cup,
    wherein the three light emitting diode chips are disposed on the first, second and third substrate electrodes, respectively, and
    wherein the two zener diodes are disposed on two of the fourth, fifth and sixth substrate electrodes, respectively.

16. The light emitting diode package according to claim 13, further comprising three zener diodes disposed on the bottom surface of the reflective cup,
    wherein the three light emitting diode chips are disposed on the first, second and third substrate electrodes, respectively, and
    wherein the three zener diodes are disposed on the fourth, fifth and sixth substrate electrodes, respectively.

17. A light emitting diode package comprising:
    an Al substrate having a reflective cup formed thereon;
    at least one light emitting diode chip disposed on a bottom surface of the reflective cup;
    an Al anodized film extending through the Al substrate to divide the bottom surface of the reflective cup into a plurality of substrate electrodes;
    at least one zener diode disposed on the bottom surface of the reflective cup
    wherein at least one of the substrate electrodes is surrounded by the Al anodized film,
    wherein the substrate electrodes are connected to a light emitting diode chip, respectively
    wherein the light emitting diode chip comprises one light emitting diode chip,
    the plurality of substrate electrodes include first and second substrate electrodes which formed by the bottom surface of the reflective cup divided by Al anodized film extending through the Al substrate, wherein at least one of the first and second substrate electrodes is surrounded by the Al anodized film, and wherein the first and second substrate electrodes are electrically connected to the light emitting diode chip, respectively,
    wherein the light emitting diode chip is disposed on the first substrate electrode, and wherein the zener diode is disposed on the second substrate electrode.

* * * * *